(12) United States Patent
Okimura

(10) Patent No.: US 7,508,008 B2
(45) Date of Patent: Mar. 24, 2009

(54) LIGHT-EMITTING DEVICE

(75) Inventor: Katsuyuki Okimura, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 11/764,088

(22) Filed: Jun. 15, 2007

(65) Prior Publication Data

US 2008/0006841 A1    Jan. 10, 2008

(30) Foreign Application Priority Data

Jul. 10, 2006    (JP) .............................. 2006-189493

(51) Int. Cl.
*H01L 29/20* (2006.01)
(52) U.S. Cl. .......... 257/99; 257/E33.056; 257/E33.058; 257/E33.059; 257/100
(58) Field of Classification Search .................... 257/99, 257/100
See application file for complete search history.

(56) References Cited

U.S. PATENT DOCUMENTS 5,986,333 A    11/1999   Nakamura ................... 257/667

2006/0163602 A1 *  7/2006   Isokawa ..................... 257/100

FOREIGN PATENT DOCUMENTS

| JP | 61-152046 | 10/1986 |
| JP | 10-242369 | 11/1998 |
| JP | 2004-111937 | 8/2004 |
| JP | 20055433 A * | 6/2005 |

OTHER PUBLICATIONS

Korean Office Action and Translation (5 pgs).

* cited by examiner

*Primary Examiner*—David A Zarneke
(74) *Attorney, Agent, or Firm*—Hayes Soloway P.C.

(57) ABSTRACT

A light-emitting device includes a ceramic package including a mounting space defined by a rectangular mounting surface and side walls erected from respective sides of the mounting surface, an electrode pad disposed on the mounting surface, a light-emitting element disposed on the electrode pad, and a molded synthetic resin filling the mounting space. The mounting surface includes corners that are not covered with said electrode pad so that a ceramic base of said ceramic package is exposed at said corners.

4 Claims, 2 Drawing Sheets

Related ART

LIGHT-EMITTING DEVICE

This application is based upon and claims the benefit of priority from Japanese patent application No. 2006-189493, filed on Jul. 10, 2006, the disclosure of which is incorporated herein in its entirety by reference.

BACKGROUND OF THE INVENTION

1. Field of the Invention

The present invention relates to a light-emitting device including a light-emitting element mounted in a ceramic package.

2. Description of the Related Art

There is known a light-emitting device including a light-emitting element (also referred to as "LED chip") disposed in a package. The package is made of synthetic resin or ceramics. The ceramics is advantageous in that it has a lower thermal resistance than the synthetic resin and can efficiently release the heat of the LED chip.

Light-emitting devices employing a ceramic package are generally of a structure wherein an LED chip disposed in the mounting space in the ceramic package is encased in molded synthetic resin. For mounting as large an LED chip as possible in the ceramic package or mounting as many LED chips as possible in the ceramic package, i.e., for obtaining as large an effective mounting area in the ceramic package as possible, it is desirable to provide a rectangular mounting surface in the ceramic package. The reason for such a rectangular mounting surface is that if an LED chip which is a rectangular planar shape is mounted on a non-rectangular mounting surface such as a circular or elliptical mounting surface, then a large dead space is created in the ceramic package and the effective mounting area is reduced in the ceramic package.

Heretofore, it has been customary to form as large an electrode pad as possible on a rectangular mounting surface on the bottom of the mounting space, and to place an LED chip on the electrode chip. If a single electrode pad is to be formed, then it is formed on the entire mounting surface. If a plurality of electrode pads are to be formed, then, as shown in FIG. 2 of the accompanying drawings, electrode pads 50 are formed with necessary minimum clearances provided therebetween, and LED chips 51 are disposed on the selected electrode pad from among electrode pads 50. The clearance provided between electrode pads 50 serve to provide electric insulation. In either case, it can be seen from FIG. 2 that the rectangular mounting surface has four corners covered with electrode pads 50.

However, if the mounting surface (mounting space) is rectangular in shape, then when the molded synthetic resin that fills the mounting space expands and contracts as the LED chips are heated and then cooled, stress that has developed in the molded synthetic resin concentrates on the corners of the mounting space, tending to cause the molded synthetic resin to peel off.

JP-A No. 2004-111937 discloses a light-emitting device wherein a ceramic base is exposed around a light reflector for preventing molded synthetic resin that fills a cavity in a ceramic package from peeling off from the light reflector on an inner wall surface of the cavity. In the disclosed light-emitting device, both the light reflector and the ceramic base are covered with the molded synthetic resin.

The cavity in the ceramic package disclosed in JP-A No. 2004-111937 is of an essential oval shape and, as a mounting space, has a non-rectangular bottom serving as a mounting surface. This is because the invention disclosed in JP-A No. 2004-111937 is not concerned with a technology for solving the problem of molded synthetic resin peel-off that is caused when stress that develops as the molded synthetic resin expands and contracts concentrates on particular spots in the mounting space. Consequently, the invention disclosed in JP-A No. 2004-111937 is unable to avoid a peel-off of the molded synthetic resin at the corners of the mounting space which is caused if the mounting surface is rectangular in shape and electrode pads are formed in as wide a range as possible on the mounting surface.

Therefore, there is a trade-off between increasing the mounting area and peel-off of the molded synthetic resin. If priority is given to increasing the size of the mounting area, then the molded synthetic resin becomes liable to peel off, and if the molded synthetic resin is not to peel off, then the mounting surface needs to have a shape that is free of corners, such as a circular or elliptical shape.

SUMMARY OF THE INVENTION

It is an object of the present invention to provide a light-emitting device which is of a structure for making a molded synthetic resin less liable to peel off even if a mounting surface for mounting a light-emitting element thereon is of a rectangular shape so that the size of the mounting area is increased.

To achieve the above object, there is provided in accordance with the present invention a light-emitting device comprising a ceramic package including a mounting space defined by a rectangular mounting surface and side walls erected from respective sides of the mounting surface, an electrode pad disposed on the mounting surface, a light-emitting element disposed on the electrode pad, and a molded synthetic resin filling the mounting space. The corners of mounting surface that are not covered with the electrode pad and the ceramic base of the ceramic package is exposed at the corners.

In the light-emitting device according to the present invention, the molded synthetic resin is held in contact with the ceramic base at the corners of the mounting surface. Therefore, the bonding strength of the molded synthetic resin with respect to the mounting surface at the corners of the mounting surface is greater than the bonding strength of the molded synthetic resin in the other region of the mounting surface. When the molded synthetic resin that fills the mounting space in the ceramic package is expanded and contracted and stress that has developed therein concentrated on the corners of the mounting space, the molded synthetic resin is hard to peel off from the mounting surface.

The above and other objects, features and advantage of the present invention will become apparent from the following description with reference to the accompanying drawings which illustrate examples of the present invention.

DESCRIPTION OF THE PREFERRED EMBODIMENT

A light-emitting device according to an embodiment of the present invention will be described below with reference to FIGS. 1A through 1C.

Figure 1A:
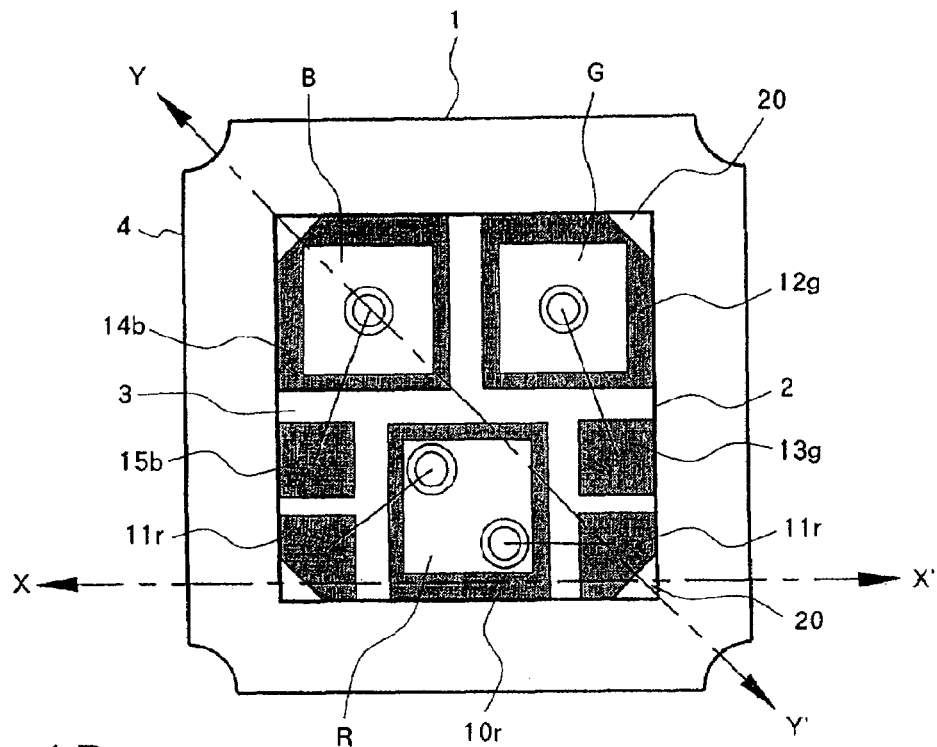
FIG. 1A is a plan view of a light-emitting device according to an embodiment of the present invention.
Figure 1B:
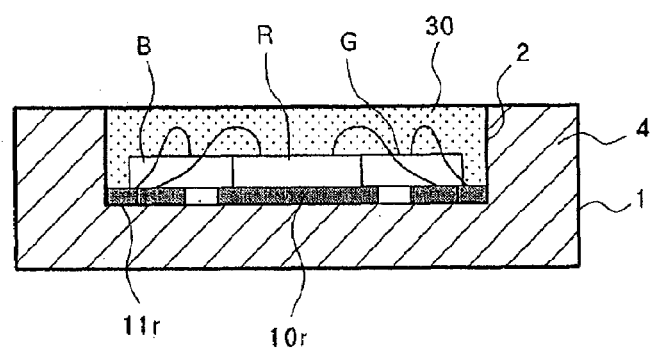
FIG. 1B is a cross-sectional view taken along line X-X' of FIG. 1A.
Figure 1C:
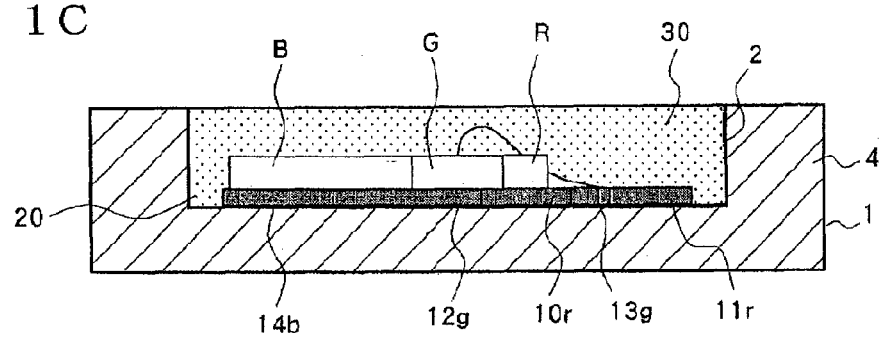
FIG. 1C is a cross-sectional view taken along line Y-Y' of FIG. 1A.
Figure 2:
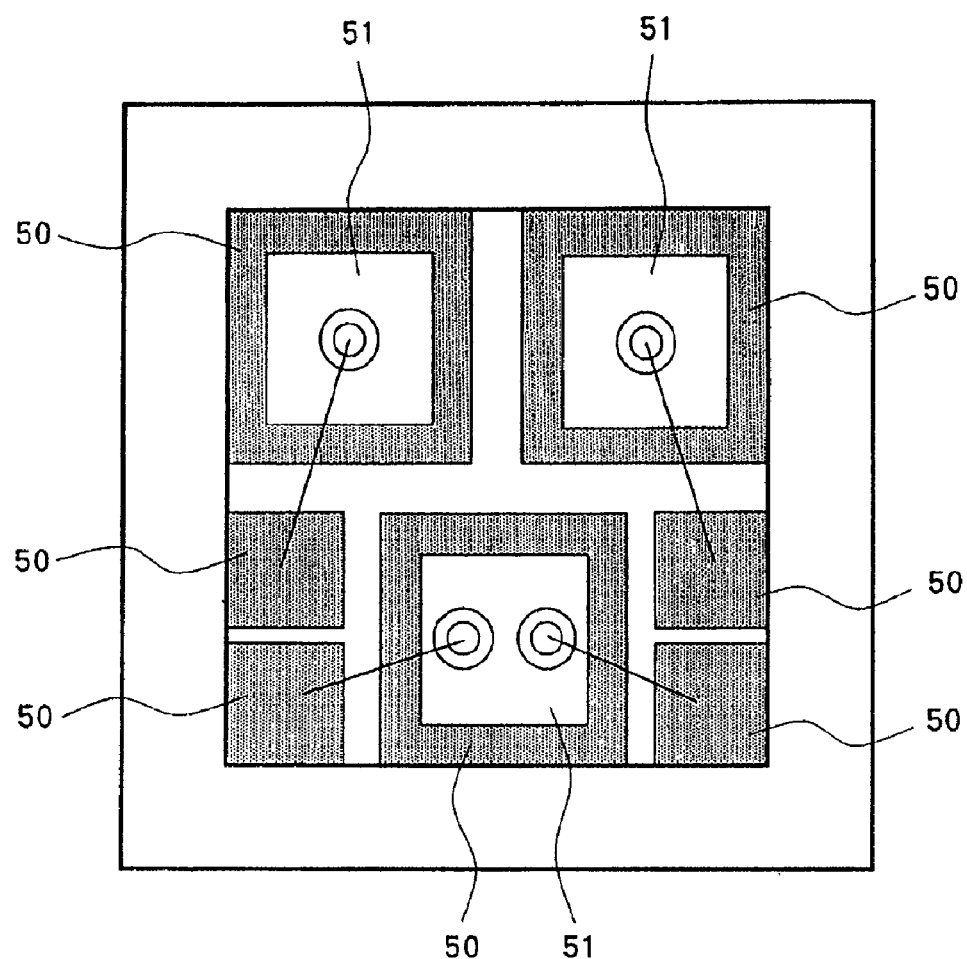
FIG. 2 is a plan view of a general light-emitting device.

As shown in FIGS. 1A through 1C, the light-emitting device according to the embodiment of the present invention includes three light-emitting elements, i.e., light-emitting element R, light-emitting element G, and light-emitting element B, mounted in mounting space 2 in ceramic package 1. Light-emitting element R emits red light, light-emitting element G emits green light, and light-emitting element B emits blue light. Therefore, the light-emitting device according to the present embodiment emits white light by way of additive color mixture.

Ceramic package 1 includes rectangular (square in the illustrated embodiment) bottom surface 3 and side walls 4 erected, or extending vertically upwardly, from respective sides of bottom surface 3. Light-emitting elements R, G, B are disposed inwardly of side walls 4. Mounting space 2 is defined inwardly of side walls 4, and bottom surface 3 serves as a mounting surface.

Seven electrode pads are formed on mounting surface 3 and are electrically connected to the corresponding light-emitting elements. Specifically, light-emitting element R is disposed on electrode pad 10r and upper electrodes of the light-emitting element R are electrically connected to two electrode pads 11r by bonding wires. Light-emitting element G is disposed on electrode pad 12g that is electrically connected to a lower electrode (not shown) on the reverse side of light-emitting element G by an electrically conductive adhesive such as an Ag paste. Electrode pad 13g is electrically connected to an upper electrode of light-emitting element G by a bonding wire. Light-emitting element B is disposed on electrode pad 14b that is electrically connected to a lower electrode (not shown) on the reverse side of light-emitting element B by an electrically conductive adhesive such as an Ag paste. Electrode pad 15b is electrically connected to an upper electrode of light-emitting element B by a bonding wire. As most clearly shown in FIG. 1A, mounting surface 3 has four corners 20 not covered with any of the electrode pads, allowing the ceramic base of ceramic package 1 to be exposed at those corners 20.

Mounting space 2 in which light-emitting elements R, G, B are mounted are filled with a silicone resin serving as molded synthetic resin 30. In the illustrated embodiment, molded synthetic resin 30 has a flat upper surface. However, the upper surface of molded synthetic resin 30 may bulge into a shell shape. The light-emitting device according to the illustrated embodiment includes a plurality of light-emitting elements R, G, B for emitting light in different colors to obtain white light. However, phosphors may be dispersed in molded synthetic resin 30 to allow a single light-emitting element to obtain white light. For example, phosphors are dispersed in molded synthetic resin 30 for emitting green light and red light by being excited by blue light emitted from light-emitting element B. The blue light emitted from light-emitting element B and the green light and the red light that are emitted from the dispersed phosphors produce white light.

In either case, since the ceramic base is exposed at the four corners of mounting surface 3, while most of molded synthetic resin 30 that fills mounting space 2 is held in contact with the electrode pads on mounting surface 3, molded synthetic resin 30 is held in direct contact with the ceramic base at the four corners of mounting surface 3. As the ceramic base is more adhesive to the synthetic resin than the electrode pads (metal), the bonding strength of molded synthetic resin at the four corners of mounting surface 3 is greater than the bonding strength of molded synthetic resin in the other region of mounting surface 3. Consequently, even when molded synthetic resin 30 expands and contracts in mounting space 2 and stress that develops therein concentrates on the four corners of mounting space 2, molded synthetic resin 30 is hard to peel off from mounting surface 3.

In order to expose the ceramic base at the four corners of mounting surface 3, electrode pads 11r, 12g, 14b may partly be removed after they are formed, or may be formed in patterns which avoid the four corners of mounting surface 3.

In the illustrated embodiment, light-emitting elements B, G have electrodes on their upper and lower surfaces, and light-emitting element R has two electrodes on its upper surface. However, the present invention is also applicable to a light-emitting device including a plurality of light-emitting elements of identical structure mounted in place or a light-emitting device including a single light-emitting element mounted in place. These other light-emitting devices operate in the same way and offer the same advantages as the illustrated light-emitting device. The molded synthetic resin that fills the mounting space may be an epoxy resin. However, the silicone resin is more preferable for encasing the light-emitting elements therein because it is less liable to deteriorate than the epoxy resin when subject to temperature changes and irradiated with light at short wavelengths.

While a preferred embodiment of the present invention has been described using specific terms, such description is for illustrative purposes only, and it is to be understood that changes and variations may be made without departing from the spirit or scope of the following claims.

What is claimed is:

1. A light-emitting device comprising:
   a ceramic package including a mounting space defined by a rectangular ceramic mounting surface and ceramic side walls erected from respective sides of said mounting surface and substantially orthogonal to said mounting surface;
   at least one electrode pad disposed on said mounting surface;
   at least one light-emitting element disposed on said at least one electrode pad; and
   a molded synthetic resin filling said mounting space;
   wherein said mounting surface includes corners that are not covered with said at least one electrode pad so that the base of the ceramic mounting surface of said ceramic package is exposed at said corners, wherein for each corner of said mounting surface, one of the at least one electrode pad contacts both of said walls adjacent to said corner.

2. A light-emitting device according to claim 1, wherein said mounting surface is of a rectangular shape having dimensions proportionate to a planar shape of said light-emitting element.

3. A light-emitting device comprising:
   a ceramic package including a mounting space defined by a rectangular ceramic mounting surface and ceramic side walls erected from respective sides of said mounting surface;
   at least one electrode pad disposed on said mounting surface;
   at least one light-emitting element disposed on said at least one electrode pad; and
   a molded synthetic resin filling said mounting space;
   wherein said mounting surface includes corners that are not covered with said at least one electrode pad so that the base of the ceramic mounting surface of said ceramic package is exposed at said corners, and wherein for each corner of said mounting surface, one of the at least one electrode pad contacts both of said walls adjacent to said corner.

4. A light-emitting device according to claim 3, wherein said mounting surface is of a rectangular shape having dimensions proportionate to a planar shape of said light-emitting element.

* * * * *